United States Patent
Boettcher et al.

(10) Patent No.: US 8,010,737 B2
(45) Date of Patent: Aug. 30, 2011

(54) METHOD AND DEVICE FOR REORGANIZING DATA IN A MEMORY SYSTEM, IN PARTICULAR FOR CONTROL DEVICES IN MOTOR VEHICLES

(75) Inventors: Joern Boettcher, Abstatt (DE); Jens Liebehenschel, Liederbach (DE); Markus Schmid, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 569 days.

(21) Appl. No.: 12/156,983

(22) Filed: Jun. 6, 2008

(65) Prior Publication Data
US 2008/0307153 A1 Dec. 11, 2008

(30) Foreign Application Priority Data
Jun. 8, 2007 (DE) .................. 10 2007 026 693

(51) Int. Cl.
*G06F 12/00* (2006.01)
(52) U.S. Cl. .............................. 711/103; 711/E12.001
(58) Field of Classification Search .................. 711/103, 711/E12.001; 340/521; 707/100
See application file for complete search history.

(56) References Cited

U.S. PATENT DOCUMENTS

| | | | | |
|---|---|---|---|---|
| 5,298,673 | A | * | 3/1994 | Iizuka et al. ................... 84/615 |
| 6,061,763 | A | | 5/2000 | Rubin et al. |
| 7,383,284 | B2 | * | 6/2008 | Heinrichs et al. ...... 707/999.103 |
| 2006/0155917 | A1 | | 7/2006 | Di Sena et al. |
| 2007/0241882 | A1 | * | 10/2007 | Panttaja et al. ............... 340/521 |

FOREIGN PATENT DOCUMENTS

| | | |
|---|---|---|
| DE | 195 06 957 | 8/1996 |
| EP | 1 031 929 | 8/2000 |
| EP | 1 187 143 | 3/2002 |
| WO | 01/31455 | 5/2001 |
| WO | WO 01/31454 | 5/2001 |
| WO | WO 02/50844 | 6/2002 |

* cited by examiner

*Primary Examiner* — Pierre-Michel Bataille
(74) *Attorney, Agent, or Firm* — Kenyon & Kenyon LLP

(57) ABSTRACT

A method for reorganizing performance quantity data in a segment of a non-volatile memory. The method encompasses the tasks or operations of generating a cohesive data block at an address space of a working memory, of performance quantity data from a first segment of the non-volatile memory and/or from the working memory, and of copying the data block to a predefined address space of the first or a second segment of the non-volatile memory in a block write operation, the performance quantity data of the data block in essence being written to the predefined address space simultaneously in the block write process.

15 Claims, 1 Drawing Sheet

METHOD AND DEVICE FOR REORGANIZING DATA IN A MEMORY SYSTEM, IN PARTICULAR FOR CONTROL DEVICES IN MOTOR VEHICLES

RELATED APPLICATION INFORMATION

The present application is based on priority German patent application no. 10 2007 026 693.8-53, which was filed in Germany on Jun. 8, 2007, the disclosure of which is incorporated herein by reference.

The present application also relates to co-pending U.S. patent application Ser. No. 12/156,979, which is being filed on the same date as the present application, which is based on priority German patent application no. 10 2007 026 690.3-53, which was filed in Germany on Jun. 8, 2007, the disclosure of which is incorporated herein by reference.

The present application also relates to co-pending U.S. patent application Ser. No. 12/156,991, which is being filed on the same date as the present application and, which is based on priority German patent application no. 10 2007 026 691.1, which was filed in Germany on Jun. 8, 2007, the disclosure of which is incorporated herein by reference.

FIELD OF THE INVENTION

The present invention relates to a method and a device for reorganizing data in a non-volatile memory of a memory system, in particular in control devices in motor vehicles.

BACKGROUND INFORMATION

Control devices for the automotive field are generally used to control and monitor functions of the vehicle engine and/or additional electrical systems in the motor vehicle. Such a control device may be equipped with a non-volatile memory in order to store various performance quantities and the like on a permanent basis, i.e., even when no supply voltage is applied, so that the control device can access data from the past as well.

The demands on the components used in the automotive field are very high, however, and in most cases require extremely high reliability during the entire service life of the motor vehicle. The demands on the non-volatile memories used in automotive control devices are therefore high as well. In general, flash memories are utilized as non-volatile memories for automotive control devices. Because of the degradation effects of the flash memory cells, the service life of a flash memory cell is limited to a specific number of write cycles. The manufacturer usually guarantees a specific number of write cycles for a flash memory for a specific overall operating period of the motor vehicle during which said control device is operated.

In an effort to reduce the frequency at which a specific memory cell of the non-volatile memory is overwritten in a control device, the size of the memory in the control device is increased and performance variables to be stored therein are written to the memory sector consecutively. If one memory sector of the memory, i.e., one segment, is filled up with performance quantity data, then the most recent performance quantity data of each type are copied to another segment in a reorganization process, and the completely written segment is erased in an erase operation immediately following or prior to a new write operation.

During the reorganization of the data, a search for the most recent performance quantity data of the completely or virtually completely written segment is implemented at present, which are then written byte-by-byte to the corresponding next segment that subsequently is to be written with performance quantity data. Furthermore, performance quantity data from a working memory of the control device, i.e., a write/read memory, which usually stores data in a volatile manner, such as a RAM, may be written to the additional segment in the reorganization of the data, i.e., a resorting of the data, for example, these data from the working memory likewise being written to the additional segment in a byte-by-byte manner. Since the writing of each byte requires a separate access operation to the non-volatile memory, the reorganization of the data in such a memory system takes time and effort.

SUMMARY OF THE INVENTION

It is an object of the exemplary embodiments and/or exemplary methods of the present invention to provide a method and a device by which the reorganization of the data in a memory system for a control device is able to be implemented more efficiently.

This object may be achieved by the method described herein and by the control device described herein.

Further advantageous developments of the exemplary embodiments and/or exemplary methods of the present invention are also described herein.

According to a first aspect, a method for reorganizing performance quantity data into a segment of the non-volatile memory is provided. The method encompasses the generation of a cohesive data block at an address space of a working memory, of performance quantity data from the segment of the non-volatile memory and/or from the working memory, and the copying of the data block to a predefined address space of the segment of the non-volatile memory in a block write operation, which may follow an erase operation of the segment. In the block write process the performance quantity data of the data block are in essence written to the predefined address space simultaneously.

According to another aspect, a method for reorganizing performance quantity data into a/one segment of the non-volatile memory is provided. The method encompasses the generation of a cohesive data block at an address space of a working memory, of performance quantity data from a first segment of the non-volatile memory and/or from the working memory, and the copying of the data block to a predefined address space of a second segment of the non-volatile memory in a block write operation. In the block write process the performance quantity data of the data block are in essence written to the predefined address space simultaneously.

One aspect of the exemplary embodiments and/or exemplary methods of the present invention is to use a block write access to a segment of the non-volatile memory to implement the reorganization of data. To this end, a data block, which is compiled in advance in a working memory of the control device, is written to the particular segment of the non-volatile memory in a block write access, simultaneously or in essence simultaneously. This considerably reduces the number of accesses to the corresponding segment of the non-volatile memory during the reorganization of the non-volatile memory in comparison with individual accesses in which the performance quantity data is written to the non-volatile memory in a byte-by-byte manner.

Furthermore, a consistency check may be implemented when generating the data block in order to compile various performance quantity data from the first segment of the non-volatile memory and the working memory as a function of the result of the consistency check, in such a way that the compilation of the performance quantity data is consistent.

According to one specific embodiment, the first segment of the non-volatile memory may be erased or be released for overwriting following the block write process. As an alternative, the second segment of the non-volatile memory may be erased or released for overwriting in advance of the block write operation.

Furthermore, the generation of the data block and the copying of the data block to the first or second segment in the block write process may be implemented when no memory space for the writing of performance quantity data to be written is available in the first segment.

According to one specific embodiment, the performance quantity data may be written to the segment of the non-volatile memory to be written consecutively and contiguously.

Furthermore, an additional contiguous data block may be generated at another address space of a working memory, the additional data block including referencing data that, for each type of performance quantity data, refer to the address in the second segment of the performance quantity data to be written to the second segment, the additional data block being copied to a predefined additional address space of the second segment of the non-volatile memory in an additional block write process.

According to another aspect, a control device for reorganizing performance quantity data in a non-volatile memory is provided, in particular for use in automotive applications. The control device includes a control unit, a non-volatile memory for the non-volatile storing of performance quantity data, and a working memory for the writing and reading of data by the control unit. The control unit is designed to generate a cohesive data block of performance quantity data from the segment of the non-volatile memory and/or from the working memory at an address space of a working memory, and to copy the data block to a predefined address space of the segment of the non-volatile memory in a block write operation, which may follow a preceding erase operation. In the block write process the performance quantity data of the data block are in essence written to the predefined address space simultaneously.

According to another aspect, a control device for reorganizing performance quantity data in a non-volatile memory is provided, in particular for use in automotive applications. The control device includes a control unit, a non-volatile memory for the non-volatile storing of performance quantity data, and a working memory for the writing and reading of data by the control unit. The control unit is designed to generate a cohesive data block at an address space of a working memory, from performance quantity data of a first segment of the non-volatile memory and/or from the working memory, and to copy the data block to a predefined address space of a second segment of the non-volatile memory in a block write operation. In the block write process the performance quantity data of the data block are in essence written to the predefined address space simultaneously.

In addition, the non-volatile memory may include a flash memory.

The control unit may be designed to implement a consistency check in order to compile various performance quantity data from the first segment of the non-volatile memory and the working memory as a function of the result of the consistency check when generating the cohesive data block, in such a way that the compilation of the performance quantity data is consistent.

Exemplary embodiments are explained in greater detail in the following text on the basis of the attached drawings.

DETAILED DESCRIPTION

Figure 1:
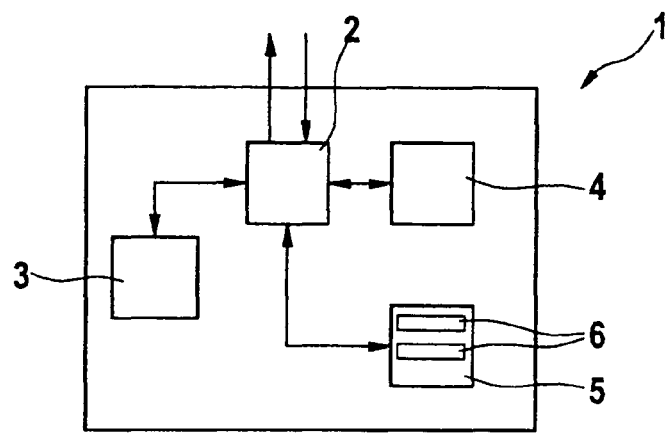
FIG. 1 shows a schematic representation of a control device according to one specific embodiment of the present invention.

FIG. 1 shows a control device 1 for use in the automotive field, for instance. Control device 1 has a control unit 2. Control unit 2 carries out methods and calculations for the control of vehicle systems such as the engine control, the control of additional electrical systems in the motor vehicle and the like. Control unit 2 is coupled to a program and static data memory 3, in which program commands for implementing the control method executed by control unit 2 as well as static data that cannot be changed are stored, e.g., constants, characteristic maps and the like. Static data memory 3 which may be a non-volatile memory to which control unit 2 is unable to write in normal operation, e.g., a ROM, flash memory, EPROM, EEPROM and the like.

In addition, control unit 2 is coupled to a working memory 4 in the form of a write/read memory, such as a RAM, i.e., a memory that allows optional writing. Working memory 4 is required in order to execute the instructions specified in read-only memory 3. Working memory 4 may be implemented as volatile memory, e.g., in the form of a SRAM (static RAM) or DRAM (dynamic memory).

In the control of systems by control unit 2 it is often necessary to detect information about the systems to be controlled, environmental conditions and the like as performance quantity data, and to update this information and permanently hold the most recent performance quantity data in readiness, even over a period of time during which control device 1 is deactivated for a particular period of time, i.e., is not supplied with a supply voltage. Data that are stored in working memory 4 are lost during such a period.

To store such performance quantity data, a non-volatile memory 5, e.g., in the form of a flash memory, to which control unit 2 may write, is therefore provided. Non-volatile memory 5 has two or more than two segments 6 for that purpose, i.e., physically separate memory sections to which performance quantity data are written in alternation. In detail, the performance quantity data are written consecutively, i.e., in series, to the address space of a first segment 6. When this first segment 6 has been written completely or nearly completely so that additional performance quantity data are no longer able to be stored therein in their entirety, the following performance quantity data to be stored are written to a second one of segments 6.

To ensure that current performance quantity data remain stored at all times during the switching of segments 6 of non-volatile memory 5, the most recent performance quantity data from first segment 6 and/or from working memory 4 are determined and written to the beginning of the address space of second segment 6 of non-volatile memory 5 before first segment 6 is erased or released for overwriting. To this end, the most recent performance quantity data of each type (according to the embodying parameters) are determined and written to the second segment in advance. The performance quantity data may be written to the particular second segment 6 in a specific sequence or unsorted, without previously specified order. Heretofore, such a write operation is implemented byte-by-byte or word-by-word (or in other data blocks having a lower bit count=<32) and requires a larger number of write accesses to non-volatile memory 5. This constitutes a higher processing load for control unit 2.

Often, a non-volatile memory 5 as provided in control devices 1 is able to implement what is known as a block write process in another operating mode, in which more than one byte is able to be written from working memory 4 to an address space of non-volatile memory 5 simultaneously. This requires a specific constellation of the data in working memory 4; in particular, the corresponding data must be available consecutively in the form of a data block. It is now provided to utilize this operating mode, and to first compile the performance quantity data to be written to a new segment 6 of the non-volatile memory in a data block in working memory 4 at the beginning and then to write the compiled data block to segment 6 of non-volatile memory 5, which is provided for the subsequent storing of performance quantity data.

Figure 2:
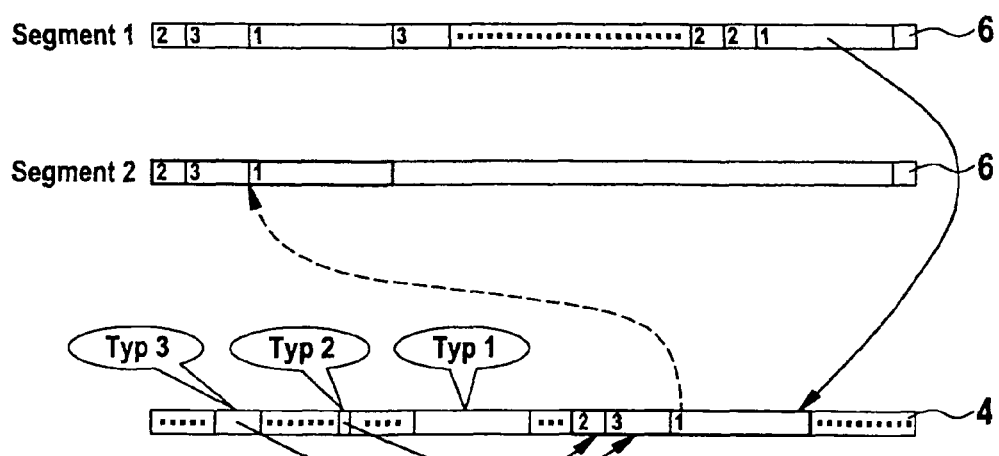
FIG. 2 shows a schematic representation of the method for reorganizing data according to another specific embodiment of the present invention.

In the ideal case, the relevant performance quantity data may be read out of full segment 6 of non-volatile memory 5 in their entirety and written to the RAM in a contiguous address space. According to the different parameters to be stored as performance quantity data, the types of the performance quantity data in the representation of FIG. 2 are denoted as type 1, type 2, and type 3. According to one specific embodiment, for each type of performance quantity data the datum having the most recent value is selected from full segment 6 of non-volatile memory 5 and copied to working memory 4. If it is determined for a particular type of performance quantity data that the value stored in full segment 6 does not represent the most recent value or that it is not in a state that is consistent with the other performance quantity data, then the performance quantity datum of the corresponding type to be stored in second segment 6 may also be copied to working memory 4 from a different position, e.g., from a different memory position of working memory 4 or from the outside. In this manner, it is possible to copy a data block of performance quantity data from first segment 6 and/or from memory positions of working memory 4 to a previously selected address space of working memory 4 in order to then write the corresponding data block to second segment 6 in a block write process.

In the illustrated exemplary embodiment of FIG. 2, the performance quantity data of type 1 from the completely written segment of non-volatile memory 5, and the performance quantity data of types 2 and 3 from working memory 4 are copied to the address space (in bold outline) that is to be copied to the newly to be written segment of non-volatile memory 5 by the block write process.

In an additional specific embodiment, the performance quantity data are written to the particular segment 6 in a specific address space in the manner described above, and a corresponding referencing datum to a referencing section at an additional address space of the segment of non-volatile memory 5. The referencing datum then indicates the type and the position, i.e., the address, where the performance quantity data of the particular type referenced by the referencing information are located. When reorganizing the performance quantity data in the switch from the first to second segment 6 of non-volatile memory 5, it is then necessary to write both the data block of the compiled performance quantity data and also an additional data block including the associated referencing information to the newly to be written segment 6 of non-volatile memory 5.

It may not be necessary to condition the data in working memory 4 in a separate space as data block. By the operation of control unit 2 it is possible that the performance quantity data in working memory 4 are set up in such a way that the performance quantity data are directly able to be transferred to the newly to be written segment 6 of non-volatile memory 5 as data block. The prerequisites for this are that the data are consistent at specific points in time and that the representation of the performance quantity data in working memory 4 corresponds to the representation of the performance quantity data in non-volatile memory 5. This would not be the case, for example, if data were stored in the non-volatile memory in encrypted form, for instance.

The method of the present invention is especially advantageous if the non-volatile memory writes a small data unit (e.g., one byte) at the same rate as a large, cohesive data block (several bytes), so that the use of the block write process makes it possible to considerably reduce the number of cycles for the writing of the performance quantity data to a segment during the reorganization of the performance quantity data. This increased rate in speed may lead to simplification of the software and to an increase in the reliability of the control device.

It is especially advantageous if the performance quantity data may be used directly from working memory 4 in their entirety, so that there is no need to search for the data block to be written via slow accesses to completely written segment 6 of non-volatile memory 5. This is important in the area of embedded systems since a voltage drop must be expected at any time. A voltage drop leads to data loss in working memory 4 if the data are located in working memory 4 only.

The method for reorganizing performance quantity data may be executed by control unit 2. The method may be realized therein by a hardware implementation, an implementation with the aid of software that corresponds to a computer program, and also by an implementation by hardware and software.

What is claimed is:

1. A control device for reorganizing performance quantity data in a non-volatile memory, comprising:
    a control unit;
    a non-volatile memory for the non-volatile storing of performance quantity data; and
    a working memory for a writing and a reading of data by the control unit;
    wherein the control unit is configured to generate a cohesive data block of performance quantity data at an address space of a working memory, the performance quantity data being obtained from at least one of (i) a first segment of the non-volatile memory and (ii) the working memory, and to copy the cohesive data block to a predefined address space of one of the first segment and a second segment of the non-volatile memory in a block write operation, the performance quantity data of the cohesive data block in essence being written to the predefined address space simultaneously in the block write process.

2. The control device of claim 1, wherein the non-volatile memory includes a flash memory.

3. A method for reorganizing performance quantity data into a segment of a non-volatile memory, the method comprising:
    generating a cohesive data block of performance quantity data at an address space of a working memory, the performance quantity data being obtained from at least one of (i) a first segment of the non-volatile memory and (ii) the working memory; and copying the cohesive data block in a block write process to a predefined address space of the first or a second segment of the non-volatile memory, the performance quantity data of the cohesive data block in essence being written to the predefined address space simultaneously in the block write process.

4. The method of claim 3, wherein the first segment of the non-volatile memory is one of erased and released for overwriting following the block write process.

5. The method of claim 3, wherein the second segment of the non-volatile memory is one of erased and released for overwriting in advance of the block write process.

6. The method of claim 3, wherein the generation of the cohesive data block and the copying of the cohesive data block to one of the first segment and the second segment in the block write process is implemented when no memory space for the writing of performance quantity data to be written is available in the first segment.

7. The method of claim 3, wherein in copying the cohesive data block in the block write process to the predefined address space of the first or the second segment of the non-volatile memory, the performance quantity data are written consecutively and contiguously.

8. The method of claim 3, wherein an additional cohesive data block is generated at another address space of the working memory, the additional cohesive data block including referencing data that, for each type of performance quantity data, refer to the address in the second segment of the performance quantity data to be written to the first or second segment, the additional cohesive data block being copied to a predefined additional address space of the first or second segment of the non-volatile memory in a further block write process.

9. A non-transitory computer readable storage medium storing a program having multiple codes which, when executed by a processor, performs a method for reorganizing performance quantity data into a segment of a non-volatile memory, the method comprising:
   generating a cohesive data block of performance quantity data at an address space of a working memory, the performance quantity data being obtained from at least one of (i) a first segment of the non-volatile memory and (ii) the working memory; and
   copying the cohesive data block in a block write process to a predefined address space of the first or a second segment of the non-volatile memory, the performance quantity data of the cohesive data block in essence being written to the predefined address space simultaneously in the block write process.

10. The non-transitory computer readable storage medium of claim 9, wherein the first segment of the non-volatile memory is one of erased and released for overwriting following the block write process.

11. The non-transitory computer readable storage medium of claim 9, wherein the second segment of the non-volatile memory is one of erased and released for overwriting in advance of the block write process.

12. The non-transitory computer readable storage medium of claim 9, wherein the generation of the cohesive data block and the copying of the cohesive data block to one of the first segment and the second segment in the block write process is implemented when no memory space for the writing of performance quantity data to be written is available in the first segment.

13. The non-transitory computer readable storage medium of claim 9, wherein in copying the cohesive data block in the block write process to the predefined address space of the first or the second segment of the non-volatile memory, the performance quantity data are written consecutively and contiguously.

14. The non-transitory computer readable storage medium of claim 9, wherein an additional cohesive data block is generated at another address space of a working memory, the additional cohesive data block including referencing data that, for each type of performance quantity data, refer to the address in the second segment of the performance quantity data to be written to the first or second segment, the additional cohesive data block being copied to a predefined additional address space of the first or second segment of the non-volatile memory in a further block write process.

15. The control device of claim 1, wherein the non-volatile memory is for use in an automotive application.

* * * * *